US012801978B2

(12) United States Patent
Koo

(10) Patent No.: US 12,801,978 B2
(45) Date of Patent: Nov. 17, 2026

(54) SUBSTRATE TREATING APPARATUS AND DATA CHANGE DETERMINATION METHOD

(71) Applicant: SEMES CO., LTD., Cheonan-si (KR)

(72) Inventor: Ki-Sung Koo, Hwaseong-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 1151 days.

(21) Appl. No.: 17/746,241

(22) Filed: May 17, 2022

(65) Prior Publication Data

US 2022/0374772 A1 Nov. 24, 2022

(30) Foreign Application Priority Data

May 18, 2021 (KR) ........................ 10-2021-0063976

(51) Int. Cl.

*G06N 20/00* (2019.01)
*G06F 18/214* (2023.01)
*H10P 74/20* (2026.01)

(52) U.S. Cl.

CPC ........... *G06N 20/00* (2019.01); *G06F 18/214* (2023.01); *H10P 74/20* (2026.01)

(58) Field of Classification Search

None
See application file for complete search history.

(56) References Cited

U.S. PATENT DOCUMENTS

| | | | | |
|---|---|---|---|---|
| 11,551,348 | B2 | 1/2023 | Zhang et al. | |
| 2020/0327654 | A1* | 10/2020 | Zhang | G06T 7/001 |
| 2022/0234164 | A1 | 7/2022 | Torikoshi et al. | |

FOREIGN PATENT DOCUMENTS

| | | | |
|---|---|---|---|
| CN | 101263499 | A | 9/2008 |
| KR | 10-2008-0055789 | A | 6/2008 |
| KR | 102032220 | B1 | 11/2019 |
| KR | 102197155 | B1 | 12/2020 |
| TW | 202105264 | A | 2/2021 |

(Continued)

OTHER PUBLICATIONS

Melville, Prem, and Raymond J. Mooney. "Diverse ensembles for active learning." In Proceedings of the twenty-first international conference on Machine learning, p. 74. 2004. (Year: 2004).*

(Continued)

*Primary Examiner* — Vincent Gonzales
(74) *Attorney, Agent, or Firm* — Harness, Dickey & Pierce, P.L.C.

(57) ABSTRACT

The inventive concept provides a substrate treating apparatus. The substrate treating apparatus includes at least one sensor configured to measure a condition of the substrate or the apparatus in a process of the treating of the substrate; a data collecting unit configured to collect in time series data measured by the sensor; and a data processing unit configured to learn the data by the data collecting unit to detect a change in a current data measured by the sensor. The data processing unit comprises a data learning unit configured to learn a data of the past collected by the data collecting unit using a Siamese network; and a data inspecting unit configured to detect whether an issue has occurred in the current data based on the learned data.

20 Claims, 8 Drawing Sheets

(56) References Cited

FOREIGN PATENT DOCUMENTS

| | | | |
|---|---|---|---|
| WO | 2007/008940 | A2 | 1/2007 |
| WO | 2020/235581 | A1 | 11/2020 |

OTHER PUBLICATIONS

Hart, Gus LW, Tim Mueller, Cormac Toher, and Stefano Curtarolo. "Machine learning for alloys." Nature Reviews Materials 6, No. 8 (2021): 730-755. (Year: 2021).*

Saqlain, Muhammad, Bilguun Jargalsaikhan, and Jong Yun Lee. "A voting ensemble classifier for wafer map defect patterns identification in semiconductor manufacturing." IEEE Transactions on Semiconductor Manufacturing 32, No. 2 (2019): 171-182. (Year: 2019).*

Li, Jiangeng, Changjian Xu, and Ting Zhang. "Similarity measure of time series based on Siamese and sequential neural networks." 2020 39th Chinese Control Conference (CCC). IEEE, 2020. (Year: 2020).*

Pei, Wenjie, David MJ Tax, and Laurens van der Maaten. "Modeling time series similarity with siamese recurrent networks." arXiv preprint arXiv:1603.04713 (2016). (Year: 2016).*

Chinese Office Action dated Apr. 25, 2025 issued in corresponding Chinese Patent Appln. No. 2022105401883.

Korean Office Action dated Oct. 25, 2022 issued in corresponding Korean Appln. No. 10-2021-0063976.

* cited by examiner

SUBSTRATE TREATING APPARATUS AND DATA CHANGE DETERMINATION METHOD

CROSS-REFERENCE TO RELATED APPLICATIONS

A claim for priority under 35 U.S.C. § 119 is made to Korean Patent Application No. 10-2021-0063976 filed on May 18, 2021, in the Korean Intellectual Property Office, the entire contents of which are hereby incorporated by reference.

BACKGROUND

Embodiments of the inventive concept described herein relate to a substrate treating apparatus and a data change determination method. More specifically, the inventive concept relates to a method for data learning using a Siamese network and determining whether a data is changed based on this.

Since data generated by semiconductor manufacturing facilities can be used for error detection through a data analysis, equipment repair using the data, and the like, the analysis of a data is an important issue in semiconductor manufacturing facilities. In this case, recognizing a data in which a change occurs is one of the important issues. Conventionally, a method for determining the difference in a data in an algorithm includes: calculating a geometric distance between two data samples, and comparing the calculated geometric distance with a predefined threshold. For example, if the calculated geometric distance is less than the threshold (distance<threshold), the two samples is determined as having "no change (no difference)". In this case, the threshold value may be a predefined value or an equation. However, when determining whether a data change has occurred using this method, there is a problem that data A1 and data A2 collected at a different time in an apparatus or a system having no issue occurrence are incorrectly determined to have a change (difference). Therefore, a need for an algorithm and a method to accurately determine whether a data has changed.

SUMMARY

Embodiments of the inventive concept provide an algorithm capable of accurately performing a determination of whether a data has changed when an issue occurs.

The technical objectives of the inventive concept are not limited to the above-mentioned ones, and the other unmentioned technical objects will become apparent to those skilled in the art from the following description.

The inventive concept provides an apparatus for treating a substrate. The apparatus for treating the substrate includes at least one sensor configured to measure a condition of the substrate or the apparatus in a process of the treating of the substrate; a data collecting unit configured to collect in time series data measured by the sensor; and a data processing unit configured to learn the data by the data collecting unit to detect a change in a current data measured by the sensor.

In an embodiment, the data processing unit comprises: a data learning unit configured to learn data of the past collected by the data collecting unit using a Siamese network; and a data inspecting unit configured to detect whether an issue has occurred in the current data based on the learned data.

In an embodiment, the data collecting unit collects a first data before an issue and a second data after the issue and the data learning unit learns the first data and the second data using the Siamese network, and learns whether a data related to the issue is the same and whether a change has occurred.

In an embodiment, the data collecting unit sequentially defines and samples pairs of the data collected in time series.

In an embodiment, the data learning unit sets any one of the first data as a reference value, and learns by setting a relationship between another first data except for the any one of the first data and the reference value as 0, and by setting a relationship between the reference value and the second data as 1.

In an embodiment, the data inspecting unit tests a validity test of a data learned by the data learning unit using a current data measured by the sensor.

In an embodiment, the data inspecting unit checks an output by inputting two datas recognized at the sensor as an input value of the Siam network learned at the data learning unit after the validity test is completed.

In an embodiment, the data inspecting unit detects a sensor in which a change has occurred by checking the output.

In an embodiment, the data inspecting unit sets a case when the output is 1 as a fourth data, and based on this sets a previous data as a third data, and checks an issue occurrence time point through checking an output through a consecutive sampling.

In an embodiment, the data inspecting unit withholds a determination when the output is different from a result learned by the data learning unit.

In an embodiment, a data collected from the at least one sensor is a numeric data related to numbers.

The inventive concept provides a method for determining whether a change has occurred in a data generated during a substrate treating process. The data change determination method includes a step for collecting a first data of before an issue occurs and a second data of after the issue occurs; a step for learning the first data and the second data through a Siamese network; and a step for detecting whether a change has occurred in a current data based on a learned Siamese network.

In an embodiment, the step for collecting the first data of before the issue occurs and the second data of after the issue occurs samples a collected time series data sequentially in defined pairs.

In an embodiment, the step for learning the first data and the second data through the Siamese network sets any one of the first data as a reference value, and learns by setting a relationship between another first data except for the any one of the first data and the reference value as 0, and by setting a relationship between the reference value and the second data as 1.

In an embodiment, the data change determination method includes a step for performing a validity test of the learned Siamese network.

In an embodiment, the step for detecting whether a change has occurred in the current data based on the learned Siamese network checks an output by inputting two datas recognized at the sensor as an input value of the Siamese network learned at the data learning unit after the validity test is completed.

In an embodiment, the data change determination method further includes a step for detecting a sensor in which a change has occurred by checking the output.

In an embodiment, the step for detecting whether a change has occurred in the current data based on the learned Siamese network sets a case of when the output is 1 as a fourth data, and based on this sets a previous data as a third data, and checks an issue occurrence time point through checking an output through a consecutive sampling.

In an embodiment, the output is withheld when a different result appears from a result learned at the Siamese network.

In an embodiment, a computer-readable recording medium has a program for executing the data change determination method.

According to an embodiment of the inventive concept, an algorithm capable of accurately performing a determination of whether a data is changed when an issue occurs is proposed.

According to an embodiment of the inventive concept, it is determined that there is no change (difference) between test sample 1 and test sample 2 collected in a device or a system in which no issue has occurred. If an issue has occurred in the device or the system, it may be determined that there is a change (difference) only in a data of a sensor related to the issue.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
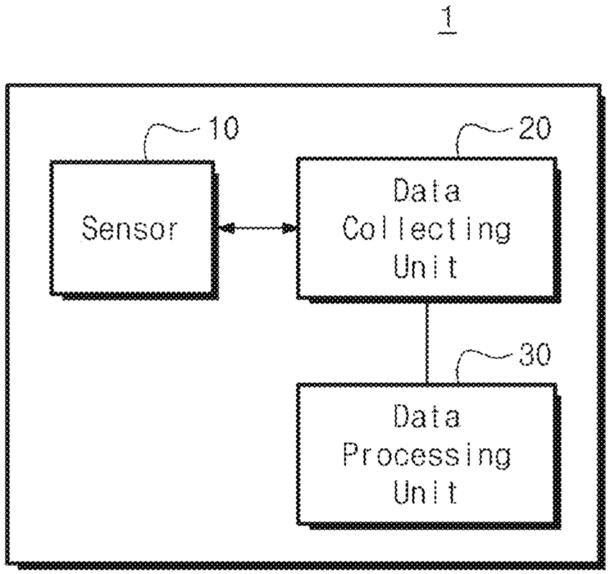
FIG. 1 is a block view illustrating a configuration of a substrate treating apparatus according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

Hereinafter, embodiments of the inventive concept will be described in detail with reference to the accompanying drawings.

FIG. 1 is a block view illustrating a configuration of a substrate treating apparatus 1 according to an embodiment of the inventive concept.

Referring to FIG. 1, the substrate treating apparatus 1 according to the inventive concept may include a sensor 10, a data collecting unit 20, and a data processing unit 30. According to an embodiment, the sensor 10 may measure a condition of a substrate or an apparatus in a process of performing a substrate treatment. In the block view of FIG. 1, the sensor 10 is illustrated as one, but a plurality of sensors 10 may be provided. The sensor 10 may be provided within the substrate treating apparatus 1 or may be provided outside. According to an embodiment, the sensor 10 may be a temperature sensor. According to an embodiment, the sensor 10 may be a pressure sensor. According to an embodiment, the sensor 10 may be a sensor that measures a condition of a substrate surface. However, the sensor 10 is not limited thereto, and may be a sensor capable of measuring parameters related with the substrate treating apparatus or the substrate treating apparatus throughout an entire processing of the substrate treating apparatus. According to an embodiment, the substrate treating apparatus 1 may be a substrate treating apparatus using a non-limiting plasma process. A process performed by the substrate treating apparatus 1 may be any process performed by the semiconductor treatment apparatus.

The data collecting unit 20 may collect in a time series a data measured by one or more sensors 10. When there are a plurality of sensors 10, the data collecting unit 20 may collect a data from each of the plurality of sensors 10. The data collecting unit 20 may collect a time series data at regular time intervals. The data collecting unit 20 may collect a first data before an issue occurs and a second data after the issue occurs, based on an issue occurrence. A detailed data collecting method will be described later with reference to the drawings.

As used herein, the term "issue" in related with data in the inventive concept may be significant events which chases a data. According to an embodiment, the issue may be a failure in the apparatus. According to an embodiment, the issue can be a sudden error event.

The data processing unit 30 may learn a data collected by the data collecting unit 20 to detect whether a change has occurred in a current data measured by the sensor 10. A detailed configuration and learning method of the data processing unit 30 will be described later with reference to the drawings.

Figure 2:
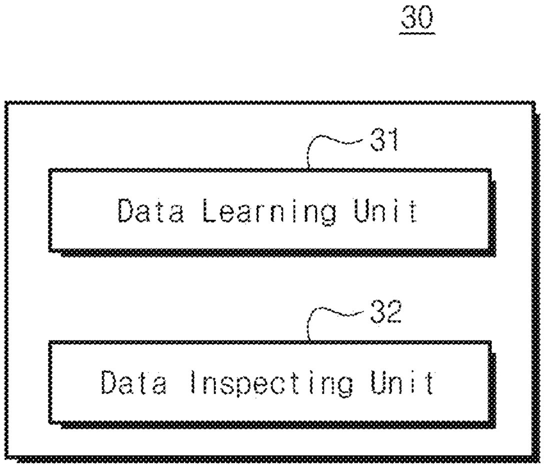
FIG. 2 is a block view illustrating a configuration of a data processing unit according to an embodiment of the inventive concept.

FIG. 2 is a block view illustrating a configuration of the data processing unit 30 according to an embodiment of the inventive concept.

The data processing unit 30 according to the inventive concept may include a data learning unit 31 and a data inspecting unit 32. The data learning unit 31 may learn using a Siamese network a data collected in the past by the data collecting unit 30. The data learning unit 31 may learn the first data and the second data using the Siamese network to learn whether a data related to the issue is the same and whether the data has changed.

The data inspecting unit 32 may detect whether an issue has occurred in a current data based on a data learned by the data learning unit 31.

According to the inventive concept, it is assumed that the issue occurs during a substrate treatment process in the substrate treating apparatus 1. In this case, a data before and after an occurrence of the issue is collected by the sensors 10 installed inside and/or outside the substrate treating apparatus 1. Based on the data collected before and after the issue, it is determined which sensors 10 has a change between the two data. These sensors 10 which have a change in data are regarded as sensors associated with a cause of the issue because a data change after the issue.

The inventive concept may be different from a conventional algorithm in using the followings at the same time. According to the inventive concept, the data collected before and after the occurrence of the issue are compared to find the sensor 10 with a change (difference) in data. According to the inventive concept, a deep learning using the Siamese network in the inventive concept determines that "there is a change (difference)" with respect to the data collected before and after the occurrence of a current issue from each sensor 10. The deep learning using the Siamese network according to the inventive concept determines "there is a change (difference)" in the data for the current occurred issue based on a data collected before and after a previously occurred issue. Conventionally, determining whether A and B, input through the Siamese network were the same was the subject, but in the case of the inventive concept, contrarily, A and B, input through the Siamese network, are the assumed to be the same and determining whether a change has occurred is the subject. According to the inventive concept, when determining whether there is a change (difference) in the data for the current issue, the Siamese network produces results only when result values are consistent. Hereinafter, a detailed method of processing the Siamese network will be described.

Figure 3A:
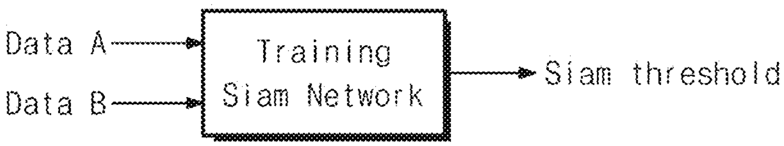
FIG. 3A to FIG. 3C are illustrate a learning through a Siamese network according to the inventive concept.
Figure 3B:
Figure 3C:
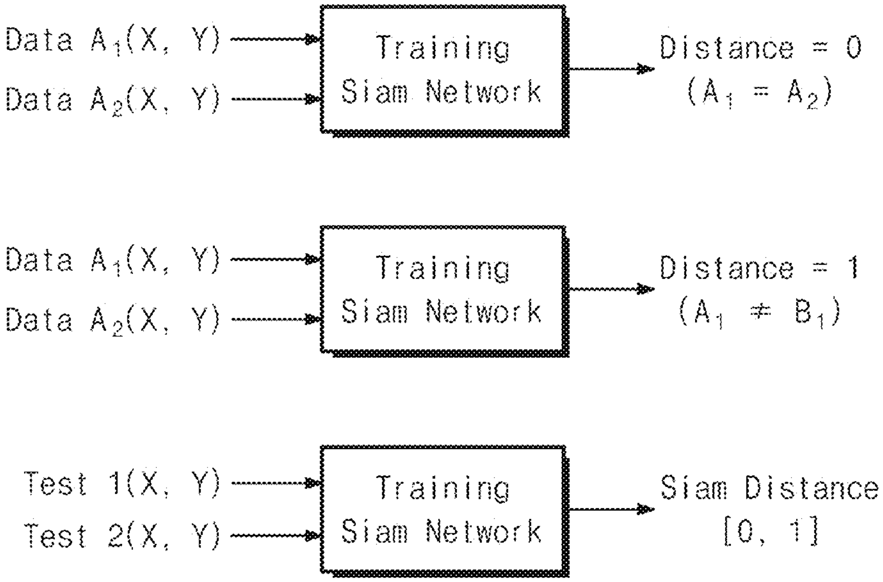

FIG. 3A to FIG. 3C are views for explaining a learning through the Siamese network according to the inventive concept.

Referring to FIG. 3, a method for determining a difference in the Siamese network is disclosed. Referring to FIG. 3A, a reference for a difference between data A and data B, that is, a siam threshold, may be learned by the Siamese network. Referring to FIG. 3B, when a learning of the Siamese network is completed, test 1 and test 2, which are input values for testing, may be input to the learned Siamese network. Then, the learned Siamese network presents a siam distance as an output for test 1 and test 2. Referring to FIG. 3C, the Siamese network according to the inventive concept can determine whether "there is a change (difference) or not" in consideration of such a siam distance based on the siam threshold. In this case, the output value may have a value between 0 and 1. In this case, when the output value is 0, it may be determined that there is no change, and when the output value is 1, it may be determined that there is a change. When the output value is a value between 0 and 1, it may be determined that there is no change when the output value is lower than the siam threshold value, and it may determined that there is a change when the output value is higher than the threshold value.

Figure 4:
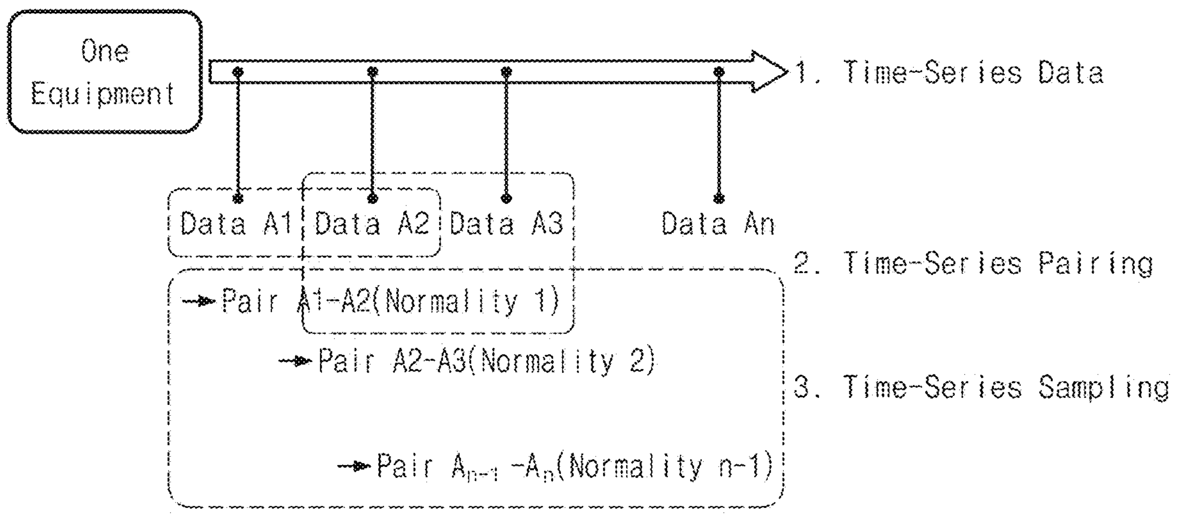
FIG. 4 illustrates a data collecting method according to the inventive concept.

FIG. 4 illustrates a data collecting method according to the inventive concept.

According to an embodiment, the substrate treating apparatus may include one or more sensors 10. Each sensor 10 included in the substrate treating apparatus may generate a data periodically. Each sensor 10 included in the substrate treating apparatus may collect data generated in a time sequence. When each sensor 10 generates time series data, a normality of the first data and the next data may be defined as a pair. According to the inventive concept, after sampling the first pair of data, the following pairs of data may be sequentially sampled in a time sequence. That is, the data collecting unit 20 according to the inventive concept may sequentially sample a normality of each data pair in time sequence.

Figure 5:
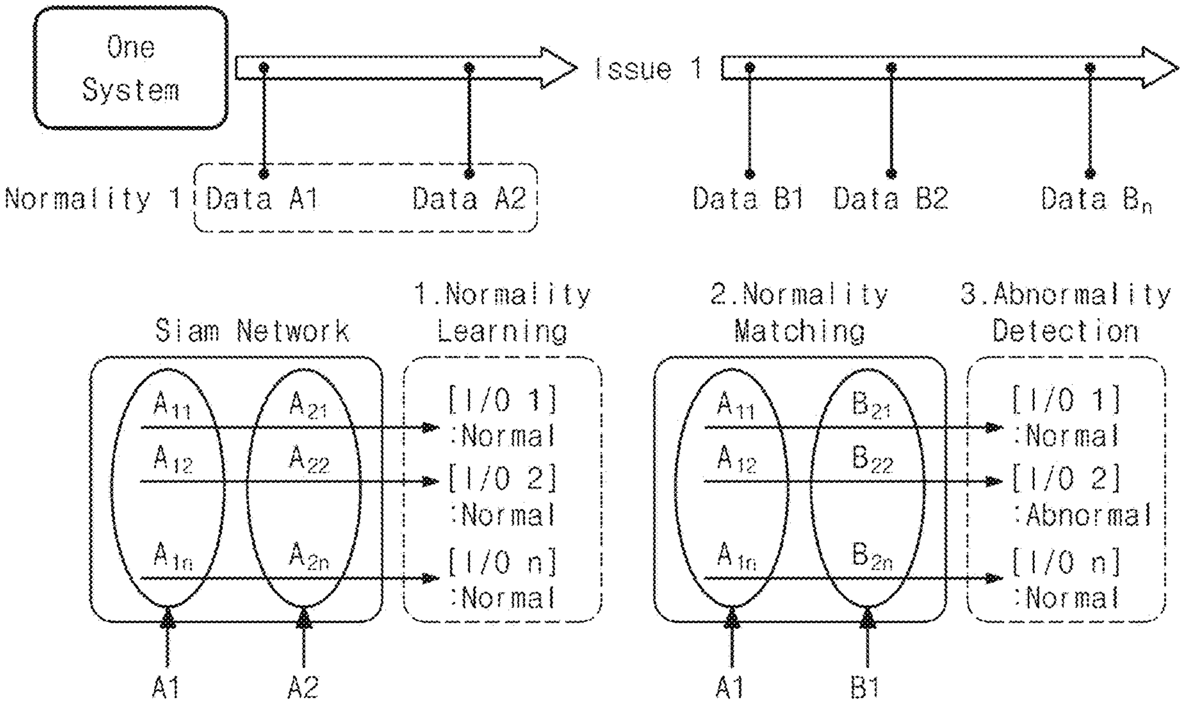
FIG. 5 illustrates a data collection and a change determination according to the inventive concept.

FIG. 5 illustrates a data collection and a defect determination according to the inventive concept.

Referring to FIG. 5, a learning may be performed using the data sampled as shown in FIG. 4. This may be a processing method of the data processing unit 30. In the Siamese network, a pair of data may be input to determine whether the input data pair are the same. Referring to FIG. 5, normal data A1 and A2 are input as inputs 1 and 2 of the Siamese network. The normal data A1 can consist of n-I/O data (A11, A12, . . . A1*n*). Likewise, the normal data A2 can consist of n-I/O data (A21, A22, . . . A2*n*). The Siamese network may be learned by matching A1 and A2 with same (corresponding) I/O data. Thereafter, a normality can be learned by each of the same I/O data at input data 1 and 2. That is, according to the inventive concept, normality tests (A1-A2, A2-A3, . . . An-A1) of n times can be implemented using n pieces of normal data (A1, A2, . . . An). Then, B1, which is a data after the issue occurrence, may be input as input 2 to perform a normality test. The learned Siamese network may detect an abnormal I/O. In accordance with the inventive concept, the abnormal I/O can be defined by a frequency of the abnormal I/O detected by the learned Siamese network or a frequency of the abnormal I/O detected in several tests by the Siamese network. After that, there is an effect of quantifying an issue association with an abnormal I/O frequency detected in several tests. According to an embodiment, when 5 abnormalities are detected in 10 tests, it may be determined that there is an issue association of 50%.

That is, according to the inventive concept, it is possible to determine whether a data changes through a learning of a Siamese network, to detect a sensor in which a related issue occurs with a determined result, and to determine an issue association through deriving the result a plurality of times.

Figure 6:
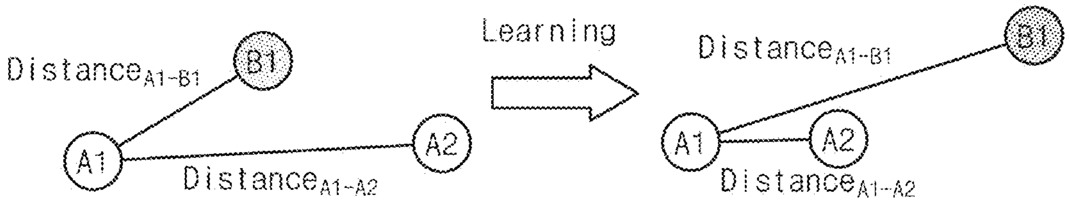
FIG. 6 illustrates a distance learning method in a Siamese network according to the inventive concept.

FIG. 6 illustrates a learning method in the Siamese network according to the inventive concept.

Referring to FIG. 6, the Siamese network may learn such that a distance between A1 and B1 is longer than a distance between A1 and A2. According to an embodiment, the Siamese network may learn a distance between A1 and B1 to be close to 1, and a distance between A1 and A2 to be close to 0. Through this process, the Siamese network can learn a data of group A and group B, which are a data of before and after an issue occurs, and through this, it is possible to check when the issue occurs and whether the issue occurs.

Figure 7:
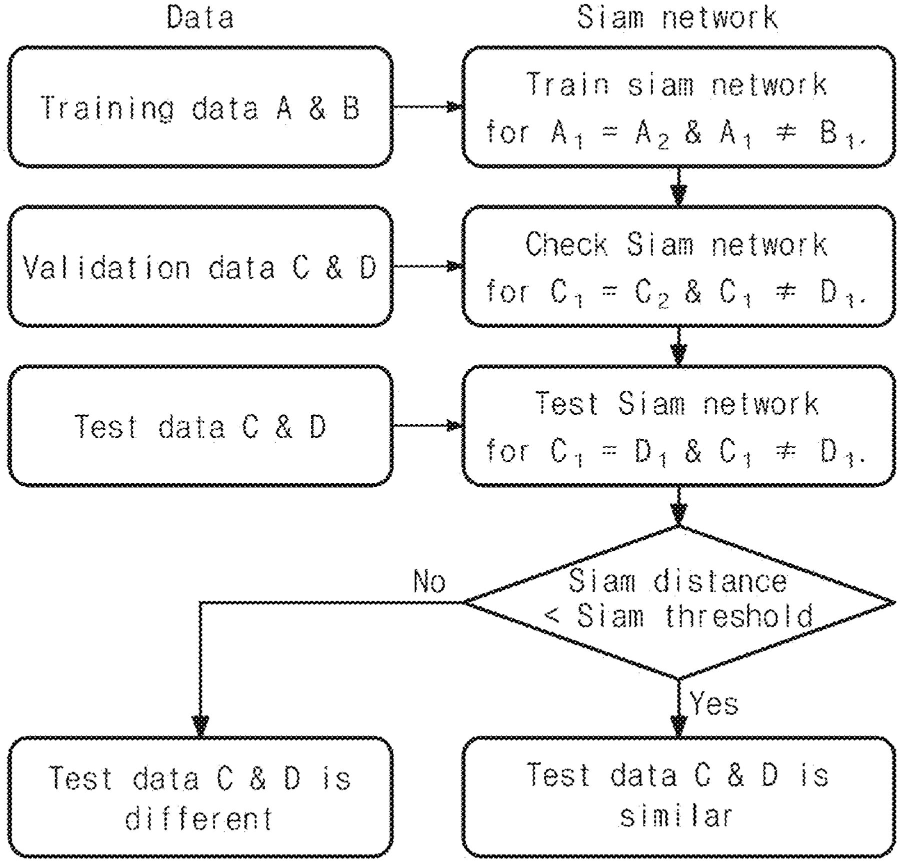
FIG. 7 is a flowchart illustrating a data change determination method according to the inventive concept.

FIG. 7 is a flowchart illustrating a data change detection method according to the inventive concept.

First, data A, B, C, and D to be described in FIG. 7 and drawings according to the inventive concept are defined as follows.

In the case of data A, a data before issue 1 occurs in one system 1 is defined as group A. In the case of data B, a data after issue 1 occurs in the same system 1 is defined as group B. In the case of data C, a data before a recurrence of issue 1 in the same system 1 is defined as group C. In the case of data D, the data after the recurrence of issue 1 in the same system 1 is defined as group D. A learning method and a method of verifying whether there is a change according to the inventive concept using the above-defined data groups will be described in more detail.

Referring to FIG. 7, the learning data may train the Siamese network through the data of group A and group B, which are a data from when the issue 1 first occurs in the same system 1. In the Siamese network, it is possible to learn that data A1 and data A2 included in group A are an unchanged data pair, and that data B1 included in group B and data A1 included in group A are a changed data pair. Once a sufficient learning is completed, a validation test can be performed using the data from group C and group D, which are a data before and after the recurrence of issue 1 in a current state. In this case, it is possible to check whether data C1 included in group C is the same as data C2 included in group C, and whether data C1 included in group C and data D1 included in group D are different. This can be checked through data pair input to the learned Siamese network. If the validity test result is determined to be valid, a test may be performed based on the data of group C and group D, which are data of before and after an occurrence of the current issue. As a result, by testing a distance between data C1 included in group C and data D1 included in group D, C and D are determined to be similar (unchanged) if the distance is smaller than a predetermined threshold, and C and D are determined to be different (changed) if the distance is greater than the predetermined threshold.

A data learning method and a determination method according to the inventive concept will be described with reference to the following drawings.

FIG. 8 to FIG. 14 illustrate a learning method according to the inventive concept in more detail.

Figure 8:
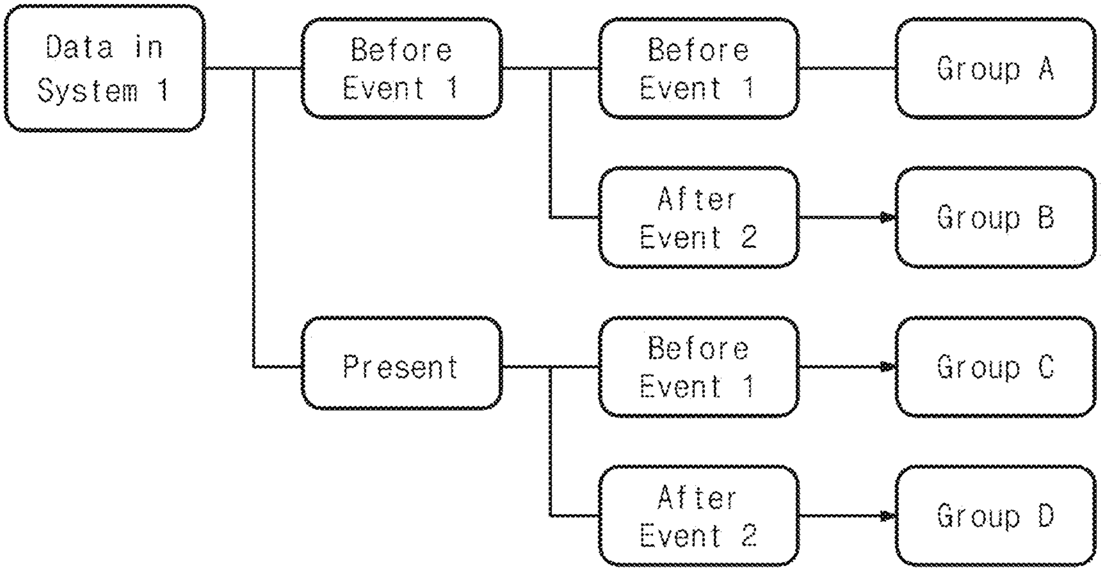
FIG. 8 to FIG. 14 illustrate a learning method and a determination method according to the inventive concept in more detail.

According to FIG. 8, a criterion for dividing a data of group A to group D is disclosed. Hereinafter, a procedure for learning an issue at the sensor to the Siamese network will be described.

Figure 9:
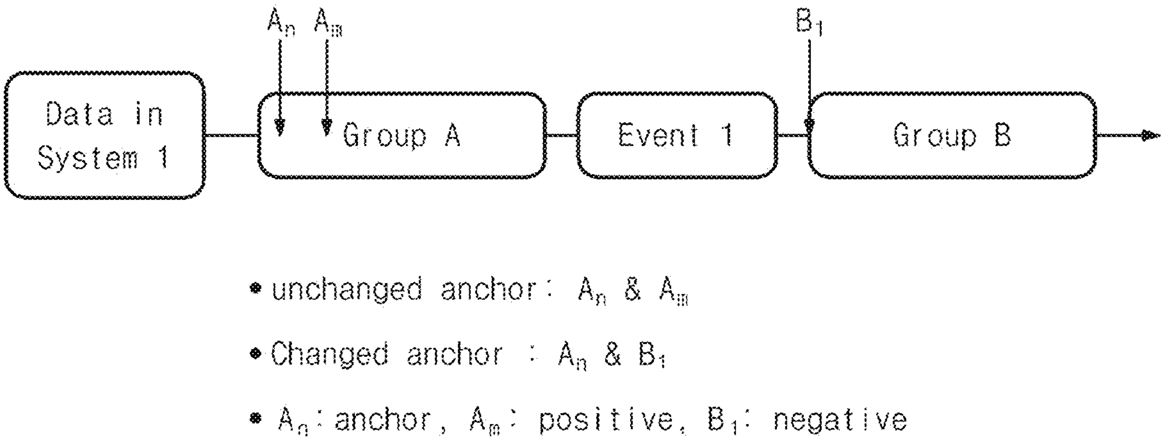

Referring to FIG. 9, a sample An may be selected from group A and set as an anchor. In this case, the anchor An may be a normal data among a data included in group A. Then, Am, not An, may be selected from group A, and a relationship between An and Am is defined as unchanged, i.e., a reference for same data. Also, B1, which is collected immediately after issue 1 occurs, is selected from group B and a relationship between An and B1 is defined as changed, i.e., a reference for different data. Thereafter, a learning of the Siamese network is divided into two stages as follows. An and Am are applied to inputs 1 and 2 of the Siamese network to learn the siam distance close to zero. In the case of An and B1, the siam distance is learned close to 1. Two convolutional neural networks (CNNs) inside the Siamese network may be provided in a same structure. The learning is a process of changing weight parameters and a bias of CNN1 and CNN2 to a same value while reducing a difference between the siam distance and a target value (0 or 1) of the Siamese network to below a certain level. This may be shown in FIG. 6.

Figure 10:
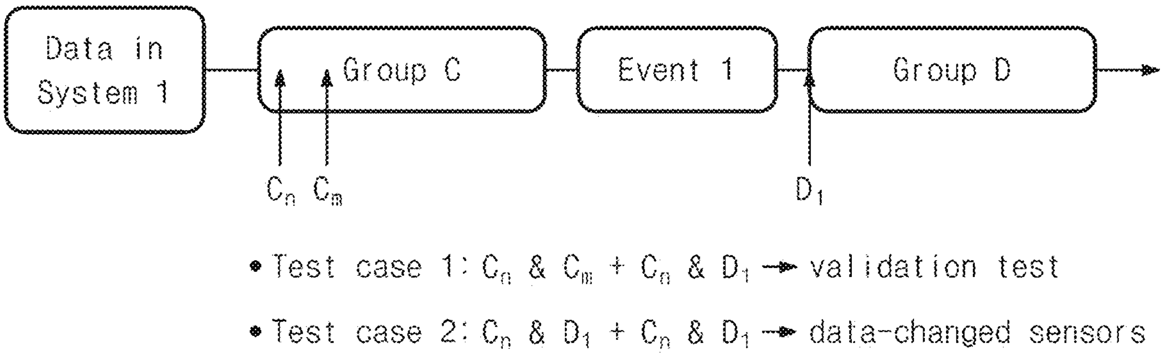

The next step shows a procedure for performing an analysis of issue 1 using the Siamese network. Referring to FIG. 10, before performing a test, a validation test of Cn & Cm, and Cn & D1, is performed. If the results are valid, Cn & D1 and Cn & D1 can be tested to find a sensor with a data change. A result can be determined to be valid if the Siamese network outputs close to 1 for the inputs, the data of group D after the issue recurrence and the data of group C before the issue recurrence and if the Siamese network outputs close to 0 for only the data of group C before the issue recurrence.

Figure 11:
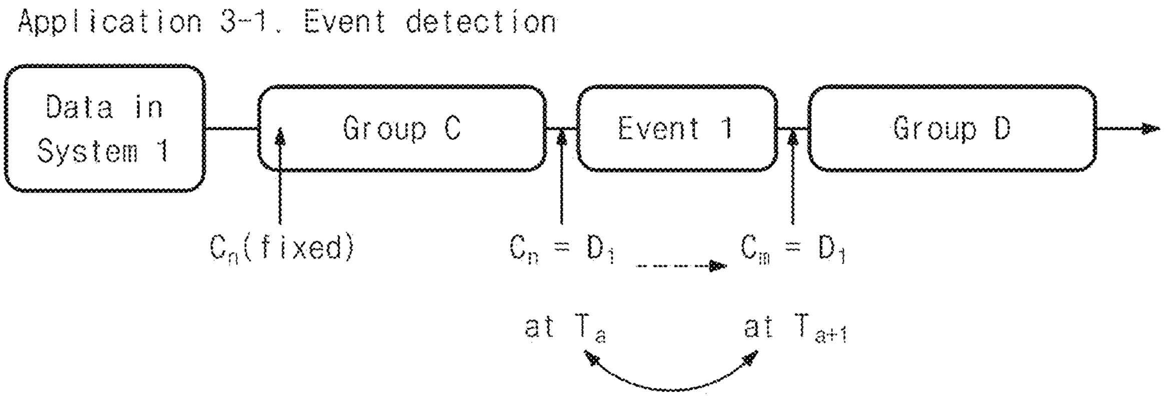

Referring to FIG. 11, when a previous issue 1 reoccurs, according to the inventive concept, data D1 collected immediately after the current issue 1 occurs is found. As a result, the data in system 1 may be divided into group C and group D based on D1. According to an embodiment, Cn (fixed) may be fixed from a normal data collected a long time before an occurrence of event 1(issue 1). According to an embodiment, Cn may be a data collected a month ago. After making Cm and D1, which are an anchor for unchanged/changed data, values to the right of Cn can be sequentially applied to Cm=D1 to determine a result. In this case, when a test result in Ta and a test result in Ta+1 show a large difference, issue 1 is considered to have occurred between Ta and Ta+1. In other words, a time point at which the issue occurs can be specified through this method.

There may be two examples of how to analyze the occurrence of an issue.

Figure 12:
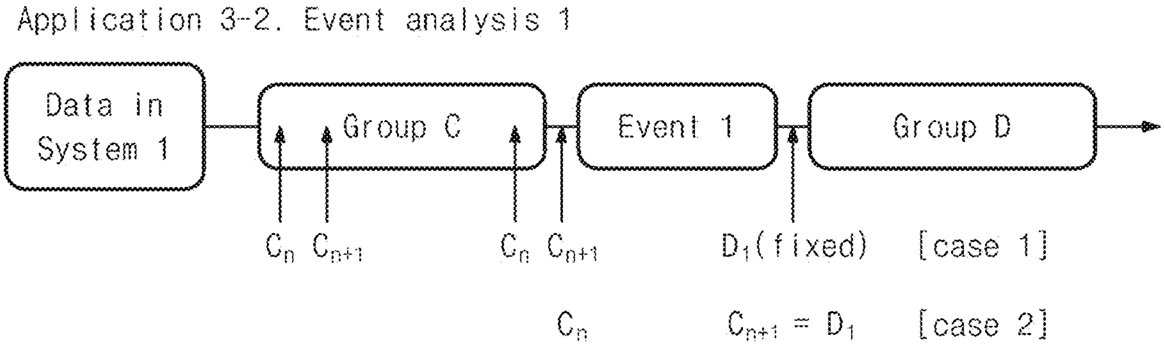

A first example is shown in FIG. 12. According to an embodiment, if D1, which is an issue data, is found, a cause of the issue is analyzed while changing the values of Cn and Cm toward D1 after fixing D1 and setting Cn and Cm adjacent to each other as shown in FIG. 12. In particular, the sensors having a change (difference) in data before and after the issue may be found while focusing on comparing case 1 and case 2 illustrated in FIG. 12.

Figure 13:
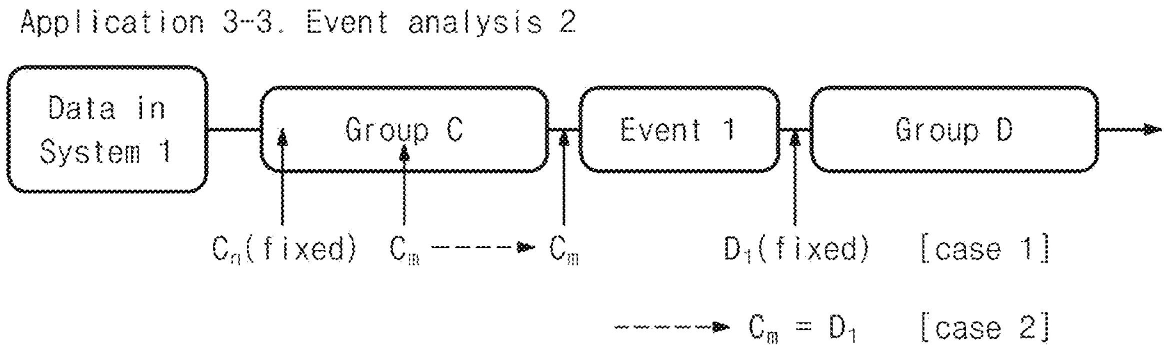

A cause analysis method according to another embodiment is disclosed in FIG. 13. Unlike the embodiment of FIG. 12, Cn and D1 are fixed and a value of Cm is moved from Cn to D1 to analyze a cause of the problem. In particular, the sensors having a change (difference) in data before and after the issue may be found while comparing mainly case 1 and case 2 shown in FIG. 13.

Through using these methods, it is possible to detect the sensor in which the issue has occurred through the data, and to check a time point at which the issue occurred.

Figure 14:
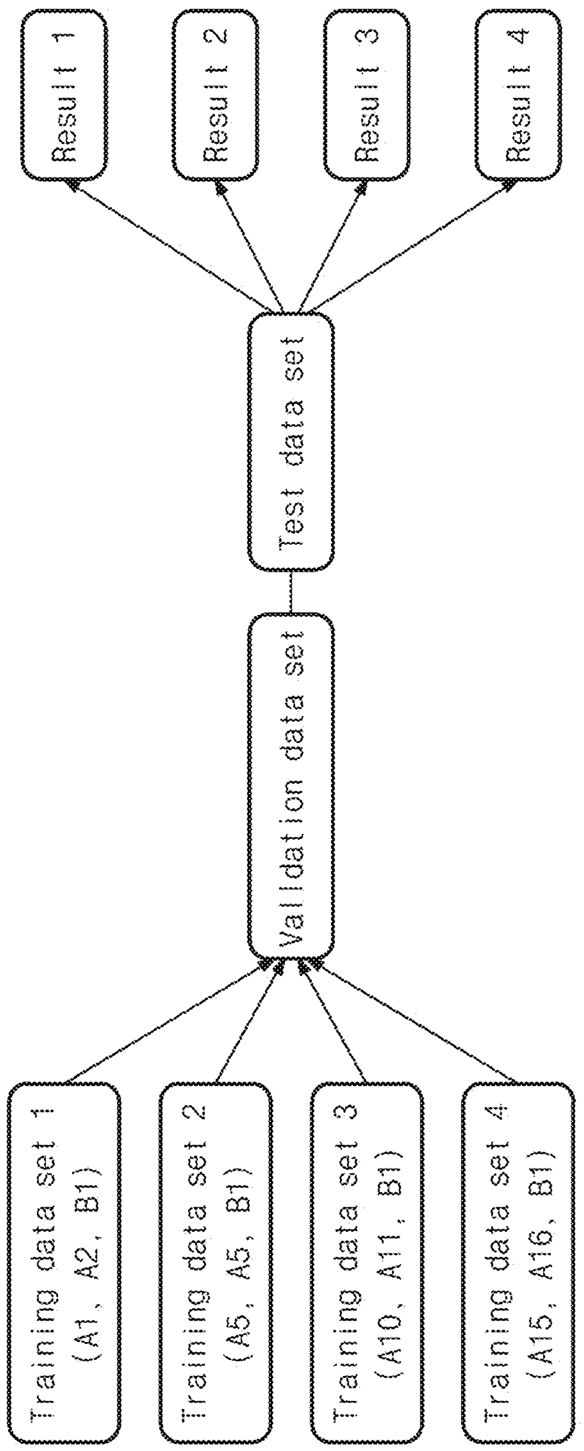

Referring to FIG. 14, a withholding of a cause analysis of the issue may be decided according to an output value. As shown in FIG. 14, if different learning data sets are set and learned in the Siamese network and the results of applying the same validation test and the test data are not consistent, the Siamese network may withhold judgment on the issue. In other words, issues that have not been previously experienced do not show consistent results. For example, for learning data sets 1 and 2, results 1 and 2 are "data changed". For results 3 and 4 for learning data sets 3 and 4, there is "no data change". When the test results are tied by 50% in a total of 4 test results, the Siamese network may withhold judgment on the results.

That is, the data change determination method according to the inventive concept can be summarized as follows. According to the inventive concept, the sensor having a data change (difference) between data A collected from a sensor of the substrate treating apparatus in normal operation and data B collected after an issue occurs may be found, and a cause of the issue may be analyzed with sensors associated with an occurrence of the issue. When analyzing the cause through a comparing of the data before and after the issue occurrence, the inventive concept differs from the conventional technology in that a criteria for determining a data change of each sensor before and after the issue are a normal data and an issue data from a same previous issue in the past. In addition, the siam threshold can be learned by using the Siamese network, and a normal data and an issue data for specific issues of the past. In addition, when specific issues are learned at the Siamese network, on current recurring issues, a collected data of before and after the current issue is input to the learned Siamese network. The Siamese network presents the siam distance on the current issue data as an output based on past issue data. If an issue that has not been experienced in the past is analyzed in the present, the Siamese network outputs "unknown" without mentioning any whether or not there is a change (difference) and puts a cause analysis of the issue on hold.

Meanwhile, the data change determination method according to the embodiment of the inventive concept described above may be implemented in the form of program instructions that may be performed through various computer means and recorded in a computer-readable recording medium. In this case, the computer-readable recording medium may include a program command, a data file, a data structure, or the like alone or in combination. Meanwhile, the program instructions recorded on the recording medium may be specially designed and configured for the inventive concept or may be known to or usable by those skilled in computer software.

The computer-readable recording medium may include hardware devices specifically configured to store and execute program instructions such as a magnetic media such as a hard disk, a floppy disk, and a magnetic tape, optical media such as a CD-ROM and a DVD, magneto-optical media such as a floptical disk, and a ROM, a RAM, a flash memory, and the like. In addition, program instructions include machine language codes such as those created by compilers, as well as advanced language codes that can be executed by computers using interpreters, etc. The above-described hardware device may be configured to operate as one or more software modules to perform the operation of the inventive concept.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. An apparatus for treating a substrate, comprising:

at least one sensor configured to measure a condition of the substrate or the apparatus in a process of the treating of the substrate;

a data collecting unit configured to execute a program stored on a computer-readable recording medium to collect, in a time series, data measured by the at least one sensor; and a data processing unit configured to detect an occurrence of an issue on the apparatus for treating the substrate by learning the data collected by the data collecting unit and detecting a change in current data measured by the at least one sensor using a Siamese network, wherein the data collecting unit sequentially defines and samples consecutive pairs of the data collected in the time series, a plurality of normality tests are performed on the consecutive pairs of the data collected in the time series to determine a frequency of abnormal I/O, an issue association is determined based on the frequency of the abnormal I/O, and the data processing unit is further configured to identify a sensor of the at least one sensor in which the change has occurred based on outputs of the Siamese network for the consecutive pairs.

2. The apparatus for treating the substrate of claim 1, wherein the data processing unit comprises:

a data learning unit configured to learn past data collected by the data collecting unit using the Siamese network; and a data inspecting unit configured to detect the issue on the apparatus for treating the substrate has occurred in the current data based on learned data.

3. The apparatus for treating the substrate of claim 2, wherein the data collecting unit collects first data before the issue on the apparatus for treating the substrate and second data after the issue on the apparatus for treating the substrate, and the data learning unit learns the first data and the second data using the Siamese network, and learns whether data related to the issue on the apparatus for treating the substrate indicates that the change has occurred.

4. The apparatus for treating the substrate of claim 3, wherein the data learning unit sets any one of the first data as a reference value, and learns by setting a relationship between another first data, except for the any one of the first data, and the reference value as 0, and by setting a relationship between the reference value and the second data as 1.

5. The apparatus for treating the substrate of claim 4, wherein the data inspecting unit tests a validity test of the first data learned by the data learning unit using the current data measured by the at least one sensor.

6. The apparatus for treating the substrate of claim 5, wherein the data inspecting unit checks a first output by inputting a plurality of data recognized at the at least one sensor as an input value of the Siamese network learned at the data learning unit after the validity test is completed.

7. The apparatus for treating the substrate of claim 6, wherein the data inspecting unit detects from a sensor of the at least one sensor in which the change has occurred by checking the first output.

8. The apparatus for treating the substrate of claim 7, wherein the data inspecting unit sets a case when the first output is 1 as a fourth data, and based on this sets a previous data as a third data, and checks an issue occurrence time point through checking a second output through a consecutive sampling.

9. The apparatus for treating the substrate of claim 6, wherein the data inspecting unit withholds a determination when the first output is different from a result learned by the data learning unit.

10. The apparatus for treating the substrate of claim 1, wherein the data collected from the at least one sensor is numeric data related to numbers.

11. An apparatus for treating a substrate, comprising:

at least one sensor configured to measure a condition of the apparatus in a process of the treating of the substrate;

a data collecting unit configured to execute a program stored on a computer-readable recording medium to collect, in a time series, data measured by the at least one sensor; and a data processing unit configured to detect an occurrence of an issue on the apparatus for treating the substrate by learning the data collected by the data collecting unit and detecting a change in current data measured by the at least one sensor, wherein the data collecting unit sequentially defines and samples consecutive pairs of the data collected in the time series, a plurality of normality tests are performed on the consecutive pairs of the data collected in the time series to determine a frequency of abnormal I/O, and an issue association is determined based on the frequency of the abnormal I/O.

12. The apparatus for treating the substrate of claim 11, wherein the data processing unit comprises:

a data learning unit configured to learn past data collected by the data collecting unit using a Siamese network; and a data inspecting unit configured to detect the issue on the apparatus for treating the substrate has occurred in the current data based on learned data.

13. The apparatus for treating the substrate of claim 12, wherein the data collecting unit collects first data before the issue on the apparatus for treating the substrate and second data after the issue on the apparatus for treating the substrate, and the data learning unit learns the first data and the second data using the Siamese network, and learns whether data related to the issue on the apparatus for treating the substrate indicates that the change has occurred.

14. The apparatus for treating the substrate of claim 13, wherein the data learning unit sets any one of the first data as a reference value, and learns by setting a relationship between another first data, except for the any one of the first data, and the reference value as 0, and by setting a relationship between the reference value and the second data as 1.

15. The apparatus for treating the substrate of claim 14, wherein the data inspecting unit tests a validity test of the first data learned by the data learning unit using the current data measured by the at least one sensor.

16. The apparatus for treating the substrate of claim 15, wherein the data inspecting unit checks a first output by inputting a plurality of data recognized at the at least one sensor as an input value of the Siamese network learned at the data learning unit after the validity test is completed.

17. The apparatus for treating the substrate of claim 16, wherein the data inspecting unit detects from a sensor of the at least one sensor in which the change has occurred by checking the first output.

18. The apparatus for treating the substrate of claim 17, wherein the data inspecting unit sets a case when the first output is 1 as a fourth data, and based on this sets a previous data as a third data, and checks an issue occurrence time point through checking a second output through a consecutive sampling.

19. The apparatus for treating the substrate of claim 16, wherein the data inspecting unit withholds a determination when the first output is different from a result learned by the data learning unit.

20. The apparatus for treating the substrate of claim 11, wherein the data collected from the at least one sensor is numeric data related to numbers.

* * * * *